US012768885B2

(12) United States Patent
Kim et al.

(10) Patent No.: US 12,768,885 B2
(45) Date of Patent: Oct. 20, 2026

(54) ERROR DETECTION SYSTEM APPLICABLE TO RTL MODULE AND OPERATION METHOD THEREOF

(71) Applicant: TELECHIPS INC., Seongnam-si (KR)

(72) Inventors: Yeongbeen Kim, Yeoju-si (KR); Jungyeun Kim, Seoul (KR); Jae Yoep Jeong, Seongnam-si (KR)

(73) Assignee: TELECHIPS INC., Seongnam-si (KR)

( * ) Notice: Subject to any disclaimer, the term of this patent is extended or adjusted under 35 U.S.C. 154(b) by 57 days.

(21) Appl. No.: 18/960,738

(22) Filed: Nov. 26, 2024

(65) Prior Publication Data

US 2025/0189578 A1 Jun. 12, 2025

(30) Foreign Application Priority Data

Dec. 7, 2023 (KR) ........................ 10-2023-0176515

(51) Int. Cl.
*G01R 31/317* (2006.01)
*G01R 31/3185* (2006.01)
*G06F 11/16* (2006.01)

(52) U.S. Cl.
CPC . *G01R 31/31703* (2013.01); *G01R 31/31725* (2013.01); *G01R 31/318566* (2013.01); *G06F 11/1629* (2013.01); *G06F 11/1641* (2013.01); *G06F 11/1645* (2013.01)

(58) Field of Classification Search
CPC ........ G01R 31/31703; G01R 31/31725; G01R 31/318566; G06F 11/1641; G06F 11/1645; G06F 30/33; G06F 9/30029; G06F 11/1441; G06F 11/263; G06F 30/327; G06F 2115/02; G06F 11/1629
See application file for complete search history.

(56) References Cited

U.S. PATENT DOCUMENTS

| | | | | |
|---|---|---|---|---|
| 9,329,872 | B2 | 5/2016 | Guerrero et al. | |
| 11,018,693 | B2 | 5/2021 | Meier | |
| 11,914,708 | B2 * | 2/2024 | Zeh | H04L 9/004 |
| 12,237,838 | B2 * | 2/2025 | Ootani | G06F 11/1641 |

(Continued)

FOREIGN PATENT DOCUMENTS

| | | | | |
|---|---|---|---|---|
| CN | 117149529 A | 12/2023 | | |
| GB | 2575668 A * | 1/2020 | | G06F 11/2043 |
| JP | 2006146319 A | 6/2006 | | |

(Continued)

*Primary Examiner* — Cynthia Britt

(57) ABSTRACT

An operation method of an error detection system includes: outputting a first electrical signal in response to one input, by a first functional block, and outputting a second electrical signal in response to the one input, by a second functional block performing the same function as the first functional block; comparing the first electrical signal and the second electrical signal to check whether there is an error in the first functional block or the second functional block, and outputting a first comparison result and a second comparison result, by a first comparator and a second comparator; and confirming an error in either the first functional block or the second functional block or confirming an error in either the first comparator or the second comparator based on the first comparison result and the second comparison result, and outputting an error report signal or a latent fault report signal according to a confirmation result.

20 Claims, 7 Drawing Sheets

(56) References Cited

U.S. PATENT DOCUMENTS

| | | | | |
|---|---|---|---|---|
| 2008/0244305 | A1* | 10/2008 | Troppmann | G06F 11/1641 712/30 |
| 2017/0074930 | A1* | 3/2017 | Nayyar | G06F 11/004 |

FOREIGN PATENT DOCUMENTS

| | | | |
|---|---|---|---|
| JP | 2014081853 | A | 5/2014 |
| JP | 2015072567 | A | 4/2015 |
| JP | 2021531568 | A | 11/2021 |
| JP | 2022-097548 | A | 6/2022 |
| KR | 10-2020-0002604 | A | 1/2020 |
| KR | 10-2021-0071469 | A | 6/2021 |

* cited by examiner

ERROR DETECTION SYSTEM APPLICABLE TO RTL MODULE AND OPERATION METHOD THEREOF

CROSS-REFERENCE TO RELATED APPLICATION

This application claims the benefit of priority under 35 U.S.C. § 119(a) to Korean Patent Application No. 10-2023-0176515 filed in the Korean Intellectual Property Office on Dec. 7, 2023, the entire contents of which are incorporated herein by reference.

BACKGROUND

(a) Field

The present disclosure relates to an error detection system applicable to a register transfer level (RTL) module having a single clock domain and multiple resets and an operating method thereof.

(b) Description of the Related Art

A dual core lockstep (DCLS) is a scheme in which two identical processor cores execute the same command and compare two results obtained by executing the same command to detect an error. The dual core lockstep is one of the important components of a fault tolerant system (FTS) capable of continuously performing specified functions even when a defect, a malfunction, an error, or the like occurs in hardware or software.

That is, even if part of the system fails, the fault tolerant system enables the entire system to continue operating normally through the dual core lockstep. The dual core lockstep is mainly used in various fields such as aerospace, automobile, and medical devices, and greatly contributes to improving functional safety by ensuring that systems implemented in each field are maintained in a safe state.

This dual core lockstep requires that the two cores be perfectly synchronized. In addition to temporal synchronization, all inputs to the dual core lockstep and external events also need to be synchronized. That is, all registers, memories, and other states of the two cores need to be identical at all times to detect an error in the system.

Therefore, the two synchronized cores need to perform all state transitions in the same order, and the two cores need to produce identical results after executing the same command. In addition, the results of the two synchronized cores need be continuously compared with each other, and an error is reported when the dual core lockstep detects a mismatch.

Therefore, when the system is operated by asynchronous inputs (e.g., resets) that change the states of the two cores regardless of the clock edge, the two cores may fail to maintain the synchronized state. This is a disadvantage in that it is not possible to determine whether the system is faulty through the dual core lockstep.

SUMMARY

The present disclosure attempts to provide an error detection system applicable to an RTL module having a single clock domain and multiple resets capable of maintaining a synchronized state and continuously performing a comparison operation between two modules even if asynchronous signals are input to the RTL module, and an operating method thereof.

An exemplary embodiment of the present disclosure provides an operation method of an error detection system operated by at least one processor, the operation method including: outputting a first electrical signal in response to one input, by a first functional block, and outputting a second electrical signal in response to the one input, by a second functional block performing the same function as the first functional block; comparing the first electrical signal and the second electrical signal to check whether there is an error in the first functional block or the second functional block, and outputting a first comparison result and a second comparison result, by a first comparator and a second comparator; and confirming an error in either the first functional block or the second functional block or confirming an error in either the first comparator or the second comparator based on the first comparison result and the second comparison result, and outputting an error report signal or a latent fault report signal according to a confirmation result.

In the outputting of the second electrical signal, the first functional block may output a delayed first electrical signal delayed by a preset number of cycles, and the second functional block may receive the input signal delayed by the preset number of cycles and output the second electrical signal.

Each of the first comparator and the second comparator may compare the delayed first electrical signal and the second electrical signal.

The outputting of the second comparison result may include: checking whether a reset signal affecting the first functional block and the second functional block is activated among a plurality of reset signals; controlling the first comparator and the second comparator to transition from an operating state to a standby state so as to stop the comparison between the delayed first electrical signal and the second electrical signal when the reset signal is activated; and operating a counter during a preset number of cycles.

The operation method may further include: after the operating of the counter, checking whether the preset number of cycles has passed based on a standby count received from the counter; and when preset number of cycles has passed, controlling the first comparator and the second comparator to transition from the standby state to the operating state.

The outputting of the latent fault report signal may include: when the first comparison result and the second comparison result match as a preset signal, outputting the error report signal informing that there is an error in either the first functional block or the second functional block; and when the first comparison result and the second comparison result do not match, outputting the latent fault report signal informing that there is a fault in either the first comparator or the second comparator.

The operation method may further include: after the outputting of the latent fault report signal, checking whether an error clear signal has been received; and when an error clear signal has been received, comparing a new first electrical signal and a new second electrical signal input after a time at which the error clear signal has been received.

Another exemplary embodiment of the present disclosure provides an error detection system including: one or more functional blocks each receiving an input signal at a first time and outputting an electrical signal in response to the input signal; delay modules each connected to either an input terminal or an output terminal of each of the one or more functional blocks, and delaying the electrical signal or the input signal by a preset number of cycles; one or more comparators each connected to the output terminal of one of the functional blocks or the delay module, comparing the electrical signal output from the functional block and the delayed electrical signal output from the delay module, and outputting a comparison result; and an error processor determining whether an error has occurred in one of the functional blocks or the comparators based on the comparison result output from each of the comparators.

The functional blocks may include: a first functional block outputting a first electrical signal in response to the input signal received at the first time; and a second functional block receiving an input signal delayed by a preset number of cycles by the delay module at the first time and outputting a second electrical signal in response to the delayed input signal.

The delay modules may include: a first delay module delaying the first electrical signal by a preset number of cycles to generate a delayed first electrical signal; and a second delay module delaying the input signal received at the first time by the preset number of cycles, and transmitting the delayed input signal to the second functional block.

The error detection system may further include reset synchronization modules controlling operations of the first functional block and the second functional block.

The reset synchronization modules may include: a first reset synchronization module synchronizing a reset and a reset release of the first functional block when a first reset signal affecting the first functional block is activated among a plurality of reset signals; and a second reset synchronization module synchronizing a reset and a reset release of the second functional block when the first reset signal affecting the second functional block is activated.

The comparators may include: a first comparator outputting a first comparison result and a second comparator outputting a second comparison result by comparing the delayed first electrical signal and the second electrical signal.

Each of the first comparator and the second comparator may include: a comparison module comparing the delayed first electrical signal and the second electrical signal to check whether there is an error in the first functional block or the second functional block; and a control module controlling the first comparator and the second comparator to transition from an operating state to a standby state, when the first reset signal is input, to stop the comparison of the comparison module.

Each of the first comparator and the second comparator may further include: a counter increasing a standby count during a preset number of cycles when the first reset signal is input.

Each of the first comparator and the second comparator may further include: a delayer delaying an error clear signal by a preset number of cycles and transmitting the delayed error clear signal to the control module when the error clear signal is received from the error processor.

The control module may receive the standby count from the counter, and control the comparison module to transition from the standby state to the operating state based on the received standby count.

The error processor may include: an AND gate performing an AND operation on the first comparison result received from the first comparator and the second comparison result received from the second comparator, and outputting an error report signal for either the first functional block or the second functional block.

The error processor may further include: an XOR gate performing an XOR operation on the first comparison result and the second comparison result, and outputting an operation result as a latent fault report signal for the first comparator or the second comparator.

The error processor may further include: an OR gate receiving response signals for the error report signal and the latent fault report signal, respectively, and performing an OR operation on the received response signals to generate an error clear signal.

According to the present disclosure, an error detection system having a dual core lockstep structure can detect an error in a general-purpose module with a single clock or multiple resets by performing a comparison operation of two modules for an asynchronous reset signal.

In addition, when an error is detected, it is possible to determine whether the error is an error caused by a safety mechanism or an error that has occurred in an RTL module, thereby preparing for a latent fault that may occur in the RTL module.

DETAILED DESCRIPTION OF THE EMBODIMENTS

Figure 1:
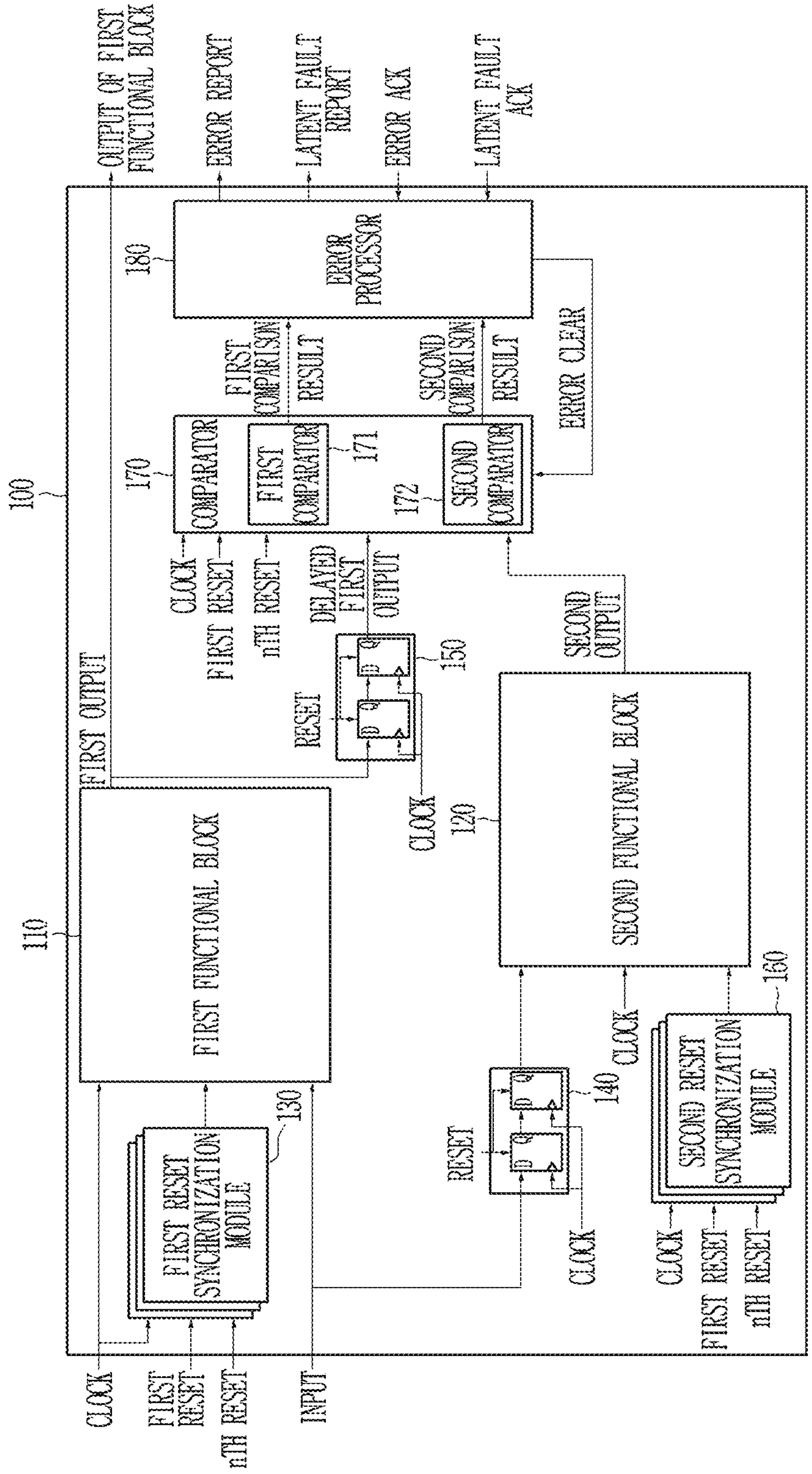
FIG. 1 is a diagram exemplifying an error detection system according to an exemplary embodiment of the present disclosure.

Hereinafter, exemplary embodiments of the present disclosure will be described in detail with reference to the accompanying drawings, so that they can be easily carried out by those of ordinary skill in the art to which the present disclosure pertains. However, the present disclosure may be implemented in various different forms and is not limited to the exemplary embodiments described herein. In order to clearly explain the present disclosure, parts irrelevant to the description will be omitted in the drawings, and like parts will be denoted by like reference signs throughout the specification.

Throughout the specification, when a certain part is referred to as "including" a certain component, this implies the presence of other components, not precluding the presence of other components, unless explicitly stated to the contrary.

Hereinafter, an error detection system applicable to an RTL module and an operation method thereof according to exemplary embodiments of the present disclosure will be described with reference to the drawings. In the exemplary embodiments of the present disclosure, the 'dual lockstep' for functional safety is referred to as an 'error detection system' for convenience of explanation, but is not necessarily limited thereto.

FIG. 1 is a diagram exemplifying an error detection system according to an exemplary embodiment of the present disclosure.

As shown in FIG. 1, an error detection system 100 applicable to an RTL module and operated by at least one processor includes a first functional block 110 and a second functional block 120 performing the same function. Although it is described in an exemplary embodiment of the present disclosure, for convenience of explanation, that the error detection system 100 includes a first functional block 110 and a second functional block 120, the error detection system 100 may include a plurality of functional blocks.

Here, the first functional block 110 and the second functional block 120 can be used as various general purpose blocks that provide various functions to a system on which the error detection system 100 is mounted, such as a CPU, which is a core element in designing a system on chip (SoC). In an exemplary embodiment of the present disclosure, the first functional block 110 and the second functional block 120 are not limited to one form.

The first functional block 110 and the second functional block 120 are synchronized with each other based on an input clock CLK. The clock according to an exemplary embodiment of the present disclosure is a signal generated in a single clock domain (not shown), and the clock is input to all components constituting the error detection system 100.

The first functional block 110 and the second functional block 120 process the input signal according to the function, and output the processed results as electrical signals according to the clock. Here, the device for transmitting the input signal or the method by which the first functional block 110 and the second functional block 120 process the input signal and provide electrical signals as outputs is an already known technology, and is not limited to one form in an exemplary embodiment of the present disclosure.

In addition, the first functional block 110 and the second functional block 120 are set to output preset electrical signals through output ports when one reset signal affecting the first functional block 110 and the second functional block 120 is input among a plurality of reset signals.

That is, it will be described as an example that when the first functional block 110 and the second functional block 120 receive the same reset signal, each of the first functional block 110 and the second functional block 120 outputs an electrical signal corresponding to a preset value of either 0 or 1. In an exemplary embodiment of the present disclosure, it will be described as an example that a first reset signal (or also referred to as a 'reset signal') among a plurality of reset signals is applied.

The reset signal is also input to all the components constituting the error detection system 100. Here, the form of the device that generates the reset signal or the method by which the components of the error detection system 100 operate based on the reset signal is diverse, and thus, is not limited to one form or method in an exemplary embodiment of the present disclosure.

The first functional block 110 operates in conjunction with one first reset synchronization module 130 that affects the first functional block 110 among a plurality of first reset synchronization modules. Then, the first functional block 110 receives a synchronized reset signal from one synchronization module that affects the first functional block 110 among the plurality of first reset synchronization modules.

In addition, the second functional block 120 operates in conjunction with one second reset synchronization module 160 that affects the second functional block 120 among a plurality of second reset synchronization modules each transmitting a reset signal. Then, the second functional block 120 receives a synchronized reset signal from the second reset synchronization module 160 operating in conjunction therewith.

At this time, the first reset synchronization module 130 synchronizes a reset release signal of the first functional block 110 in accordance with the clock. Also, the second reset synchronization module 160 synchronizes a reset release signal of the second functional block 120 in accordance with the input clock. The reason why the first reset synchronization module 130 and the second reset synchronization module 160 synchronize the reset signal or the reset release signal is to synchronize timings at which the two functional blocks 110 and 120 operate in preparation for an asynchronous reset signal.

Each of the first reset synchronization module 130 and the second reset synchronization module 160 includes a plurality of modules. This is to provide synchronized reset signals to other functional blocks (not shown) that constitute the error detection system 100 in addition to the first functional block 110 and the second functional block 120 of FIG. 1.

In an exemplary embodiment of the present disclosure, it will be described as an example that the first functional block 110 and the second functional block 120 are affected by first reset signals. Therefore, the first functional block 110 receives a first reset signal of the first reset synchronization module 130, and the second functional block 120 receives a first reset signal of the second reset synchronization module 160.

Meanwhile, a first delay module 150 is connected to an output terminal of the first functional block 110. The first delay module 150 delays an output of the first functional block 110 for a preset period of time and transmits the delayed output to a comparator 170.

Also, a second delay module 140 is connected to an input terminal of the second functional block 120. The second delay module 140 delays an input signal for a preset period of time so that the delayed input signal is input to the second functional block 120.

Here, the first delay module 150 and the second delay module 140 control the first functional block 110 and the second functional block 120 to operate at times that are different by a preset number of cycles, in order to control the operation timings of the first functional block 110 and the second functional block 120 separately. In an exemplary embodiment of the present disclosure, it will be described as an example that the operation timings of the first functional block 110 and the second functional block 120 are controlled such that the first functional block 110 and the second functional block 120 operate at times that are different by two cycles.

In an exemplary embodiment of the present disclosure, it is described as an example that the first delay module 150 and the second delay module 140 are implemented with two D flip-flops, but are not necessarily limited thereto.

In a case where the first functional block 110 and the second functional block 120 operate at the same time without the first delay module 150 and the second delay module 140, an error that has occurred in one of the two functional blocks can be detected.

However, if errors occur simultaneously in the two functional blocks 110 and 120, equal values at which the errors have occurred are output. In this case, the comparator 170 may not detect the errors in the two functional blocks 110 and 120 by comparing the equal values.

Therefore, in an exemplary embodiment of the present disclosure, the first functional block 110 and the second functional block 120 perform the same function at different operation timings, so that the comparator 170 can easily detect an error.

The comparator 170 according to an exemplary embodiment of the present disclosure detects whether there is an error in the first functional block 110 or the second functional block 120 by comparing two outputs. That is, the comparator 170 according to an exemplary embodiment of the present disclosure compares the delayed first output of the first functional block 110 with the second output of the second functional block 120 using a plurality of comparators 171 and 172.

Although it is described in an exemplary embodiment of the present disclosure as an example that it is detected that an error has occurred in either the first functional block 110 or the second functional block 120, another functional block may be added to determine whether an error has occurred in either the first functional block 110 or the second functional block 120.

In addition, although it is described in an exemplary embodiment of the present disclosure as an example that the comparator 170 includes a first comparator 171 and a second comparator 172, the number of comparators is not limited to two.

Each of the first comparator 171 and the second comparator 172 receives the delayed first output of the first functional block 110 and the second output of the second functional block 120. The first comparator 171 and the second comparator 172 transmit respective comparison results, i.e., a first comparison result and a second comparison result, to an error processor 180, each of the comparison results being obtained by comparing the delayed first output and the second output.

Based on the first comparison result and the second comparison result output from the comparators 171 and 172, the error processor 180 determines whether an error has occurred in the first functional block 110 or the second functional block 120 or whether a latent fault has occurred in the comparator 170 itself.

The error processor 180 receives the first comparison result and the second comparison result from the first comparator 171 and the second comparator 172, respectively.

Then, based on the received two comparison results, the error processor 180 determines whether there is an error in either the first functional block 110 or the second functional block 120, or whether the error is an error caused by a latent fault that has occurred in the comparator 170.

In addition, the error processor 180 reports an error or a latent fault to an external system (not shown) according to the determined type of error.

That is, the error processor 180 reports an 'error' to the external system when the first comparator 171 and the second comparator 172 transmit equal comparison results. However, when the error processor 180 receives different comparison results from the first comparator 171 and the second comparator 172, the error processor 180 reports an 'error caused by a latent fault' to the external system.

In addition, when reporting either an error or a latent fault to the external system and receiving an ACK signal (error ACK or latent fault ACK) corresponding thereto, the error processor 180 transmits an error clear signal indicating that the error report is complete to the first comparator 171 and the second comparator 172. When receiving the error clear signal from the error processor 180, the first comparator 171 and the second comparator 172 check whether there is an error in another functional block.

The structure of the comparator 170 in the error detection system 100 will be described with reference to FIG. 2.

Figure 2:
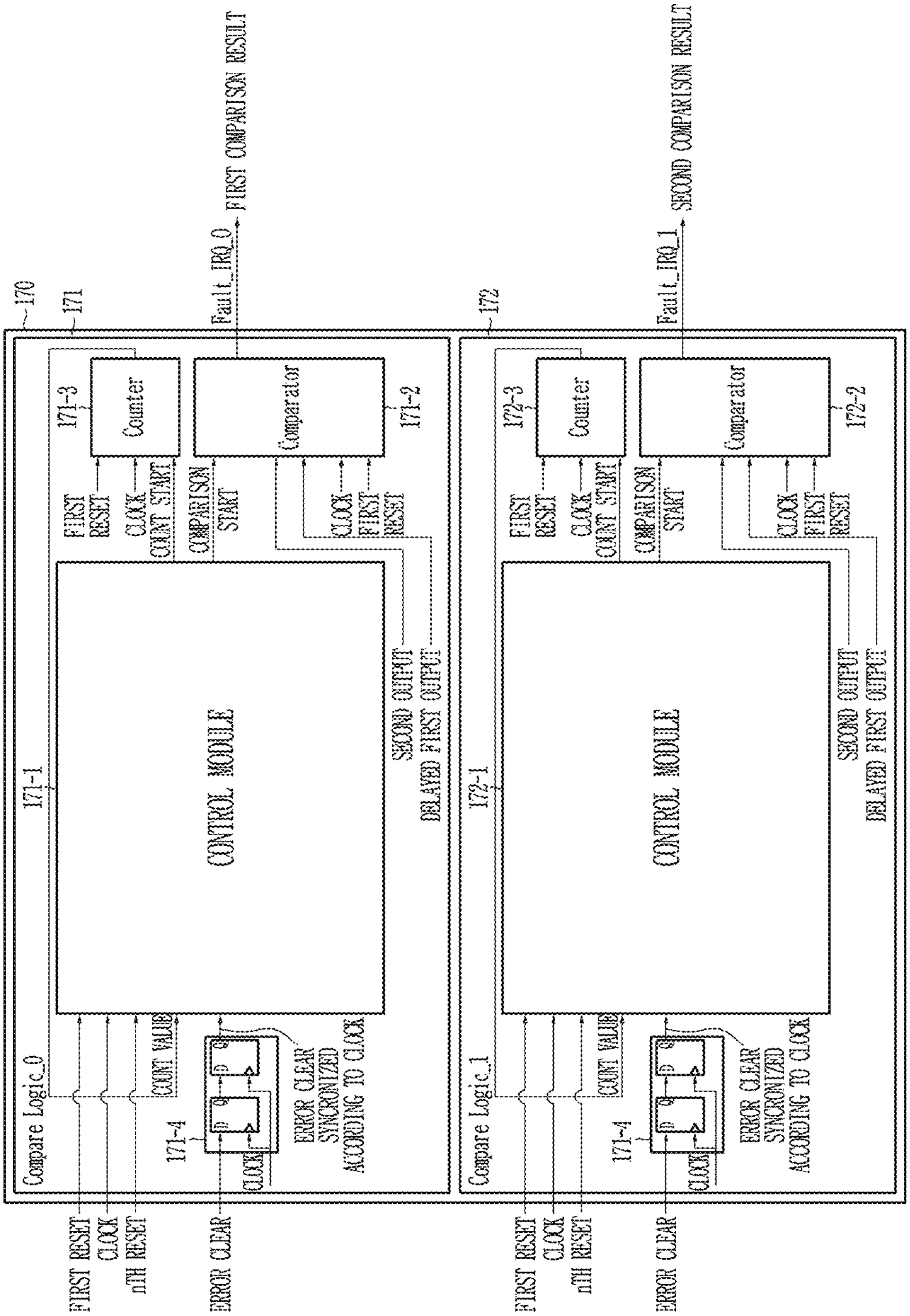
FIG. 2 is a structural diagram of a comparator according to an exemplary embodiment of the present disclosure.

FIG. 2 is a structural diagram of a comparator according to an exemplary embodiment of the present disclosure.

As shown in FIG. 2, the comparator 170 includes a first comparator 171 and a second comparator 172. In an exemplary embodiment of the present disclosure, it is described as an example that the first comparator 171 and the second comparator 172 include identical components, that is, the first comparator 171 and the second comparator 172 are implemented by duplicating the same circuit in pair.

Each of the first comparator 171 and the second comparator 172 includes a control module 171-1 or 172-1, a comparison module 171-2 or 172-2, a counter 171-3 or 172-3, and a delayer 171-4 or 172-4.

When a reset signal is input, each of the control modules 171-1 and 172-1 controls the state of the comparator 171 or 172 to transition from an "operation" state to a "standby" state. In addition, each of the control modules 171-1 and 172-1 receives a standby count from the counter 171-3 or 172-3, and controls the state of the comparator 171 or 172 to transition from the "standby" state to the "operation" state or to maintain the "standby" state based on the received standby count.

When the counter 171-3 or 172-3 receives a counter start signal from the control module 171-1 or 172-1, the counter increases the count value by 1 as a clock is received. Then, the value increased by 1 is transmitted to the control module 171-1 or 172-1 as a standby count.

Each of the comparison modules 171-2 and 172-2 compares a delayed output of the first functional block 110 with an output of the second functional block 120. Then, each of the comparison modules 171-2 and 172-2 outputs a comparison result. In an exemplary embodiment of the present disclosure, the comparison results output from the comparison modules 171-2 and 172-2 are referred to as a 'first comparison result' and a 'second comparison result', but are not necessarily limited thereto.

At this time, each of the comparison modules 171-2 and 172-2 may compare the delayed output of the first functional block 110 with the output of the second functional block 120, stop the comparison, or re-execute the stopped output comparison based on a control signal transmitted from each of the control modules 171-1 and 172-1.

When receiving an error clear signal from the error processor 180, each of the delayer 171-4 and 172-4 delays the error clear signal by a preset number of cycles. And, the delayed error clear signal is transmitted to each of the control modules 171-1 and 172-1.

The reason why each of the delayer 171-4 and 172-4 delays the error clear signal by a preset number of cycles is to prepare for a case where an ACK signal is applied from an external system and is not synchronized with the clock. The error clear signal generated by the ACK signal may transition while not synchronized with the clock.

Therefore, in order to prevent an abnormal operation caused by an unsynchronized error clear signal, the delayers 171-4 and 172-4 delay error clear signals. In an embodiment of the present disclosure, it is shown that the delayers 171-4 and 172-4 are included in the comparator 170, but may be included in an external system.

Next, a structure of an error processor according to an exemplary embodiment of the present disclosure will be described with reference to FIG. 3.

Figure 3:
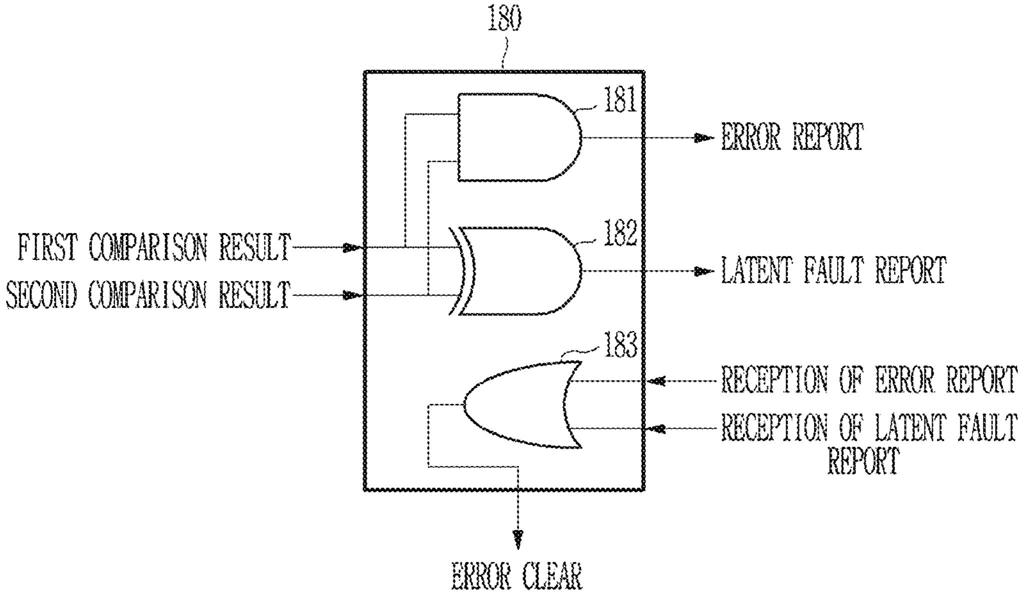
FIG. 3 is a structural diagram of an error processor according to an exemplary embodiment of the present disclosure.

FIG. 3 is a structural diagram of an error processor according to an exemplary embodiment of the present disclosure.

As shown in FIG. 3, it is described as an example that the error processor 180 includes an AND gate 181, an XOR gate 182, and an OR gate 183.

The AND gate 181 performs an AND operation on the first comparison result and the second comparison result, and transmits an operation result as an error report signal to the external system. The AND gate 181 is used to check if there is an error in either the first functional block 110 or the second functional block 120.

The XOR gate 182 performs an XOR logic operation on the first comparison result and the second comparison result, and transmits an operation result as a latent fault report signal to the external system. That is, the XOR gate 182 determines whether an error has occurred in either the first comparator 171 or the second comparator 172, and when an error has occurred, the XOR gate 182 notifies the external system of the occurrence of the error as a latent fault.

When receiving a positive acknowledgement response signal ACK indicating that the error report and the latent fault report have been received from the external system, the OR gate 183 performs an OR logic operation and transmits an error clear signal to the first comparator 171 and the second comparator 172.

Next, an operation method of the error detection system 100 described above will be described with reference to FIG. 4.

Figure 4:
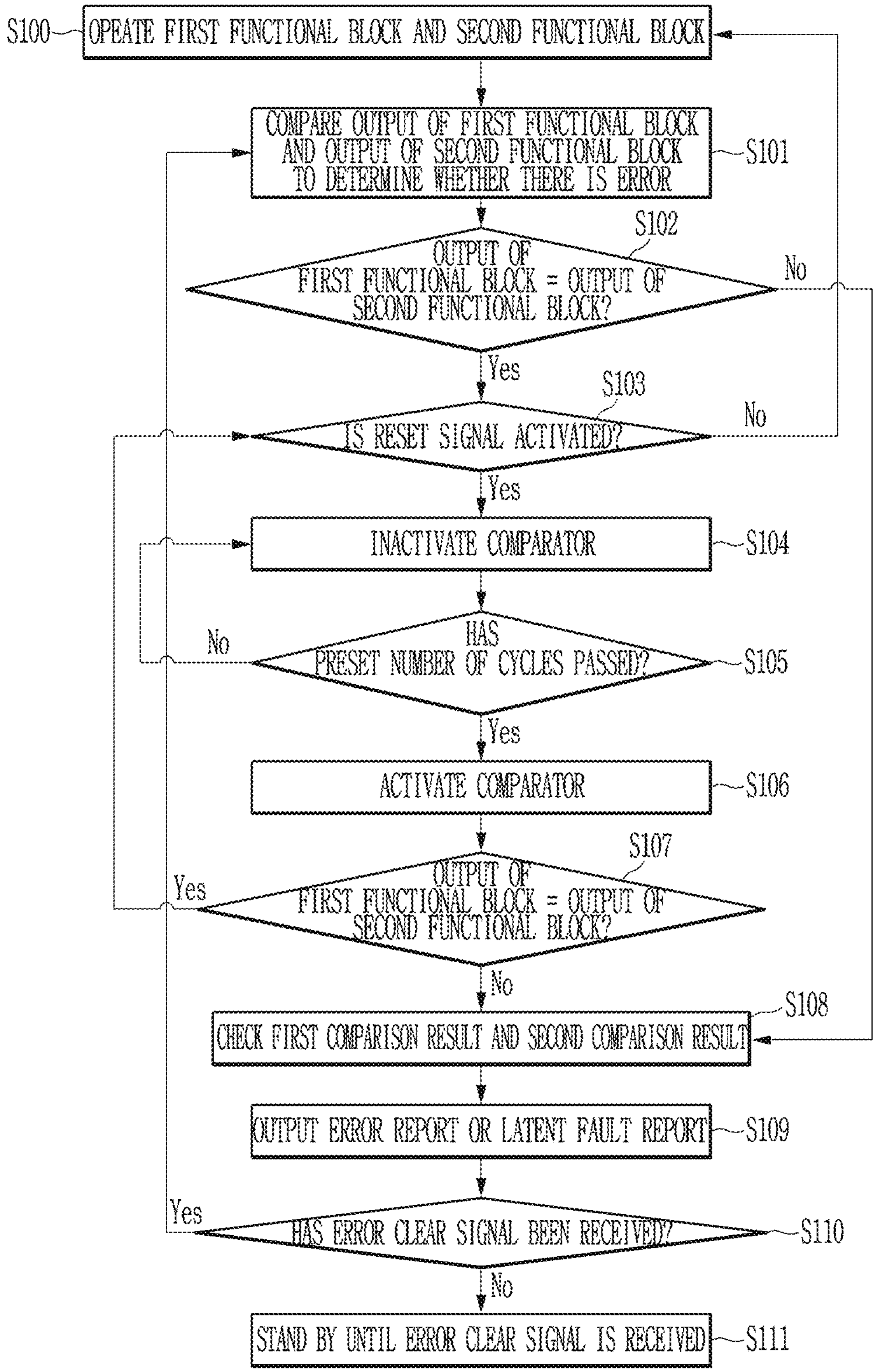
FIG. 4 is a flowchart of an operation of an error detection system according to an exemplary embodiment of the present disclosure.

FIG. 4 is a flowchart of an operation of an error detection system according to an exemplary embodiment of the present disclosure.

As shown in FIG. 4, each of the first functional block 110 and the second functional block 120 of the error detection system 100 operates to output one of the preset electrical signals as 0 or 1 (S100). Then, the comparator 170, which is constituted by the first comparator 171 and the second comparator 172, compares an output of the first functional block 110 and an output of the second functional block 120 to determine whether there is an error in either the first functional block 110 or the second functional block 120 (S101).

In addition, each of the comparison modules 171-2 and 172-2 compares the output of the first functional block 110 and the output of the second functional block 120 input thereto to check whether the outputs of the two functional blocks match (S102). When the outputs of the two functional blocks do not match, the process proceeds to step S108, which will be described later.

When the outputs of the two functional blocks match as a result of the check in step S102, each component of the error detection system 100 receives a reset signal as an input from another external system (not shown) and checks whether the reset signal is activated (S103). That is, all components that constitute the error detection system 100 confirm that the reset signal has been generated.

Here, the first comparator 171 and the second comparator 172, which constitute the error detection system 100, also confirm that the reset signal has been generated. Then, the control modules 171-1 and 172-1 included in the first comparator 171 and the second comparator 172, respectively, control the comparison modules 171-2 and 172-2 that compared outputs to transition to an inactivated state so that the outputs are not compared (S104).

That is, when a reset signal is generated, the control modules 171-1 and 172-1 of the first comparator 171 and the second comparator 172 that were in a comparing state control the first comparator 171 and the second comparator 172 to transition from an active state to a standby state. At the same time, the control modules 171-1 and 172-1 operate the counters 171-3 and 172-3 to increase the standby count one by one during a preset number of cycles. As a result, the counters 171-3 and 172-3 count by 1 every cycle in accordance with a clock signal during the preset number of cycles under the control of the control modules 171-1 and 172-1 and transmit results to the control modules 171-1 and 172-1.

Therefore, each of the control modules 171-1 and 172-1 checks the standby count transmitted from each of the counters 171-3 and 172-3 and checks whether the preset number of cycles has passed (S105). When the preset number of cycle has not elapsed, the comparison modules 171-2 and 172-2 are kept in the inactivated state according to step S104.

However, when the preset number of cycles has elapsed, the control modules 171-1 and 172-1 control the comparison modules 171-2 and 172-2 to transition from the inactivated state to the active state (S106). Then, each of the comparison modules 171-2 and 172-2 compares an output of the first functional block 110 and an output of the second functional block 120 to check whether the outputs of the two functional blocks match (S107).

The comparison modules 171-2 and 172-2 output whether the outputs of the two functional blocks match as a first comparison result and a second comparison result, respectively. Then, the error processor 180 checks whether the first comparison result and the second comparison result match (S108). This is to determine whether the error is an actual error in the functional block 110 or 120 or a latent error in the comparator 171 or 172, because there may be a failure in the comparator 171 or 172 although there is no error in the functional block 110 or 120.

When the first comparison result and the second comparison result match, the error processor 180 outputs an error report to the external system. However, when the first comparison result and the second comparison result do not match, the error processor 180 outputs a latent fault report (S109).

When receiving the error report or the latent fault report from the outside, the error processor 180 transmits a report completion signal to the comparators 171 and 172. Each of the comparators 171 and 172 checks whether an error clear signal has been received from the error processor 180 (S110), and when an error clear signal has not been received, each of the comparators 171 and 172 stands by until an error clear signal is received (S111).

However, when an error clear signal has been received, the error detection system 100 periodically checks whether a reset signal is activated from the outside (S103). When the reset signal is activated, step S104 and the subsequent steps are repeatedly performed, and when the reset signal is not activated, step S100 and the subsequent steps are repeatedly performed.

Next, a timing diagram according to the operation of the error detection system described above will be described with reference to FIGS. 5 to 7. In an exemplary embodiment of the present disclosure, it is described as an example that the time when reset is activated corresponds to a low state in the timing diagram, and the time when reset is inactivated and the functional block 110 or 120 operates corresponds to a high state.

Figure 5:
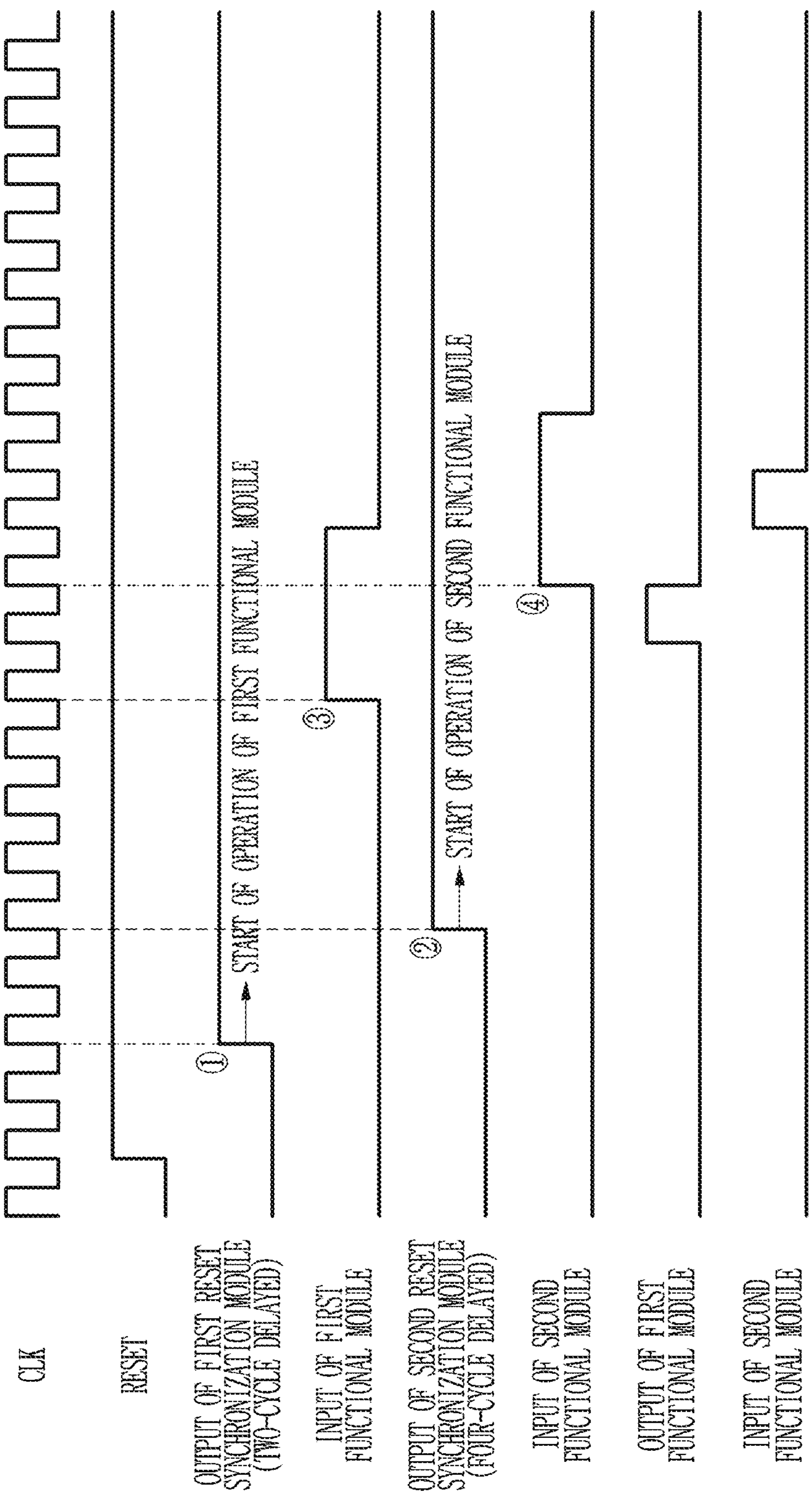
FIGS. 5 to 7 are examples of timing diagrams according to an exemplary embodiment of the present disclosure.
Figure 6:
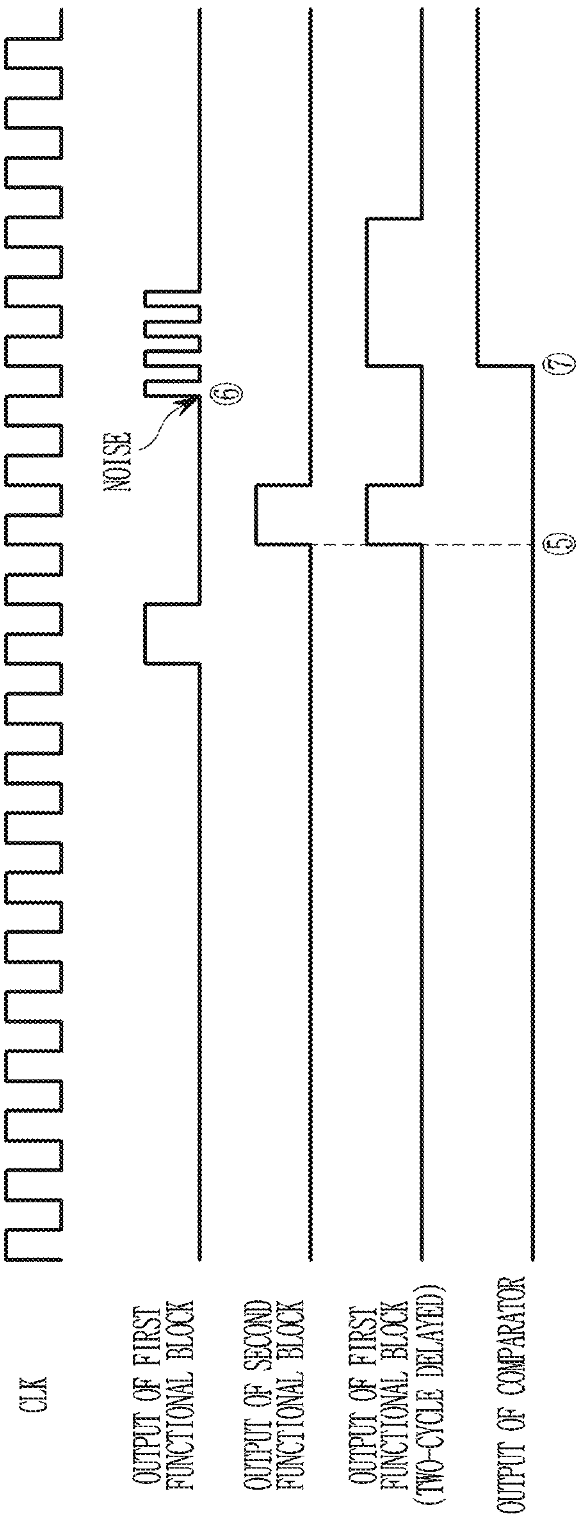
Figure 7:
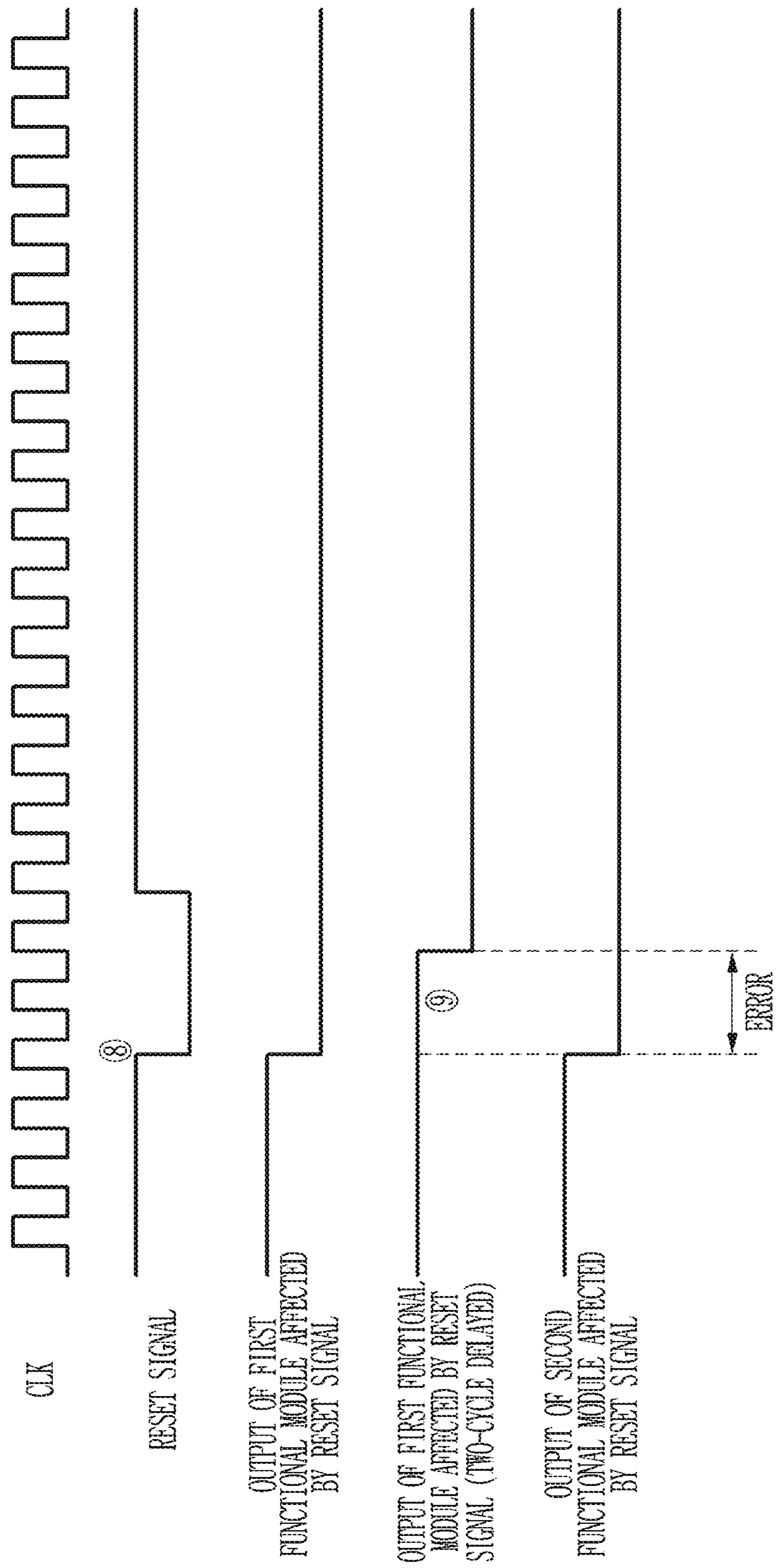

FIGS. 5 to 7 are examples of timing diagrams according to an exemplary embodiment of the present disclosure.

First, as shown in FIG. 5, the components of the error detection system 100, i.e., the first functional block 110, the second functional block 120, the first reset synchronization module 130, and the second reset synchronization module 160, are synchronized with each other after a preset number of clock cycles after reset is inactivated.

That is, when reset is inactivated by the first reset synchronization module 130 and the second reset synchronization module 160, and the operations of the two functional blocks 110 and 120 are synchronized after a predetermined number of clock cycles, the timings at which the operations of the components start are different by two cycles (①, ②). In addition, the timings of the input signal applied to the first functional block 110 and the input signal applied to the second functional block 120 through the second delay module 140 are also different by two cycles (③, ④)

In this way, input signals applied to the first functional block 110 and the second functional block 120 and output signals output from the first functional block 110 and the second functional block 120 are all identically different by two cycles.

In addition, as shown in FIG. 6, the comparator 170 compares a delayed first output signal obtained by delaying the first output of the first functional block 110 by two cycles using the first delay module 150 with the second output signal of the second functional block 120 (⑤).

When the first functional block 110 or the second functional block 120 malfunctions due to any influence (⑥), this is detected by the comparator 170 (⑦). Therefore, the comparison result obtained by detecting the error in the comparator 170 may be processed by the error processor 180 and the error may be reported to another external system.

In this case, the comparator 170 needs to be prepared for the case where the first functional block 110 and the second functional block 120 have multiple resets. That is, as shown in FIG. 7, it is assumed that a reset signal activated by a reset signal source at a first time (⑧) is activated, and the first functional block 110 and the second functional block 120 are in the reset state.

Since the reset signal activated at the first time affects the first functional block 110 and the second functional block 120, the first functional block 110 and the second functional block 120 output preset values at the first time. However, the first delay module 150 maintains a previously processed value, that is, a value output from the first functional block 110 (®), before the first time when the reset signal was activated.

Accordingly, results of processing different signals in input pairs can be input to the comparator 170. As a result, even though the first functional block 110 and the second functional block 120 operate normally, the comparator 170 may falsely detect that an error has occurred in the first functional block 110 or the second functional block 120 by comparing the different signals in the input pairs.

The comparator 170 stops the comparison operation until the preset number of cycles has elapsed through the above-described method. Thereafter, when the reset signal is activated, the comparator 170 switches the state from the standby state to an operating state, and performs the comparison operation again. By doing so, in an exemplary embodiment of the present disclosure, the comparator 170 can perform the operation of comparison between the two functional blocks 110 and 120 in preparation for an asynchronous reset signal, and the dual lockstep can be universally applied to modules each having single clock and multiple resets.

Although the exemplary embodiments of the present disclosure have been described in detail above, the scope of the present disclosure is not limited thereto, and various modifications and improvements made by those skilled in the art using the basic concept of the present disclosure defined in the following claims also fall within the scope of the present disclosure.

What is claimed is:

1. An operation method of an error detection system operated by at least one processor, the operation method comprising:

outputting a first electrical signal in response to one input, by a first functional block, and outputting a second electrical signal in response to the one input, by a second functional block performing the same function as the first functional block;

comparing the first electrical signal and the second electrical signal to check whether there is an error in the first functional block or the second functional block, and outputting a first comparison result and a second comparison result, by a first comparator and a second comparator;

differentiating between a functional block error and a comparator error by:

confirming an error in either the first functional block or the second functional block when the first comparison result and the second comparison result match; or confirming a latent fault in either the first comparator or the second comparator when the first comparison result and the second comparison result do not match, and outputting an error report signal or a latent fault report signal according to a confirmation result.

2. The operation method of claim 1, wherein in the outputting of the second electrical signal, the first functional block outputs a delayed first electrical signal delayed by a preset number of cycles, and the second functional block receives an input signal delayed by the preset number of cycles and outputs the second electrical signal.

3. The operation method of claim 2, wherein each of the first comparator and the second comparator compares the delayed first electrical signal and the second electrical signal.

4. The operation method of claim 2, wherein the outputting of the second comparison result includes:

checking whether a reset signal affecting the first functional block and the second functional block is activated among a plurality of reset signals;

controlling the first comparator and the second comparator to transition from an operating state to a standby state so as to stop the comparison between the delayed first electrical signal and the second electrical signal when the reset signal is activated; and operating a counter during a preset number of cycles.

5. The operation method of claim 4, further comprising:

after the operating of the counter, checking whether the preset number of cycles has passed based on a standby count received from the counter; and when the preset number of cycles has passed, controlling the first comparator and the second comparator to transition from the standby state to the operating state.

6. The operation method of claim 1, wherein the outputting of the latent fault report signal includes:

when the first comparison result and the second comparison result match as a preset signal, outputting the error report signal informing that there is an error in either the first functional block or the second functional block; and when the first comparison result and the second comparison result do not match, outputting the latent fault report signal informing that there is a fault in either the first comparator or the second comparator.

7. The operation method of claim 1, further comprising:

after the outputting of the latent fault report signal, checking whether an error clear signal has been received; and when the error clear signal has been received, comparing a new first electrical signal and a new second electrical signal input after a time at which the error clear signal has been received.

8. An error detection system comprising:

one or more functional blocks each receiving an input signal at a first time and outputting an electrical signal in response to the input signal;

delay modules implemented on a circuit comprising a plurality of D flip-flops, each connected to either an input terminal or an output terminal of each of the one or more functional blocks, and delaying the electrical signal or the input signal by a preset number of cycles;

one or more comparators each connected to the output terminal of one of the functional blocks or the delay module, comparing the electrical signal from the functional block and the delayed electrical signal from the delay module, and outputting a comparison result; and an error processor comprising an AND gate and an XOR gate, the error processor determining whether an error has occurred in one of the functional blocks or the comparators based on the comparison result from each of the comparators.

9. The error detection system of claim 8, wherein the functional blocks include:

a first functional block outputting a first electrical signal in response to the input signal received at the first time; and a second functional block receiving the input signal delayed by a preset number of cycles by the delay module at the first time and outputting a second electrical signal in response to the delayed input signal.

10. The error detection system of claim 9, wherein the delay modules include:

a first delay module delaying the first electrical signal by a preset number of cycles to generate a delayed first electrical signal; and a second delay module delaying the input signal received at the first time by the preset number of cycles, and transmitting the delayed input signal to the second functional block.

11. The error detection system of claim 10, wherein the comparators include:

a first comparator outputting a first comparison result and a second comparator outputting a second comparison result by comparing the delayed first electrical signal and the second electrical signal.

12. The error detection system of claim 11, wherein each of the first comparator and the second comparator includes:

a comparison module implemented on a circuit for comparing the delayed first electrical signal and the second electrical signal to check whether there is an error in the first functional block or the second functional block; and a control module implemented on a circuit for controlling the first comparator and the second comparator to transition from an operating state to a standby state, when a first reset signal is input, to stop the comparison of the comparison module.

13. The error detection system of claim 12, wherein each of the first comparator and the second comparator further includes:

a counter increasing a standby count during a preset number of cycles when the first reset signal is input.

14. The error detection system of claim 13, wherein each of the first comparator and the second comparator further includes:

a delayer delaying an error clear signal by a preset number of cycles and transmitting the delayed error clear signal to the control module when the error clear signal is received from the error processor.

15. The error detection system of claim 11, wherein a control module implemented on a circuit receives a standby count from a counter, and controls a comparison module implemented on a circuit to transition from a standby state to an operating state based on the received standby count.

16. The error detection system of claim 11, wherein the error processor includes:

an AND gate performing an AND operation on the first comparison result received from the first comparator and the second comparison result received from the second comparator, and outputting an error report signal for either the first functional block or the second functional block.

17. The error detection system of claim 16, wherein the error processor further includes:

an XOR gate performing an XOR operation on the first comparison result and the second comparison result, and outputting an operation result as a latent fault report signal for the first comparator or the second comparator.

18. The error detection system of claim 17, wherein the error processor further includes:

an OR gate receiving response signals for the error report signal and the latent fault report signal, respectively, and performing an OR operation on the received response signals to generate an error clear signal.

19. The error detection system of claim 9, further comprising:

reset synchronization modules configured to synchronize a reset release signal implemented on a circuit, controlling operations of the first functional block and the second functional block.

20. The error detection system of claim 19, wherein the reset synchronization modules include:

a first reset synchronization module synchronizing a reset and a reset release of the first functional block when a first reset signal affecting the first functional block is activated among a plurality of reset signals; and a second reset synchronization module synchronizing a reset and a reset release of the second functional block when the first reset signal affecting the second functional block is activated.

* * * * *